(12) United States Patent
Garcia

(10) Patent No.: US 7,262,509 B2
(45) Date of Patent: Aug. 28, 2007

(54) MICROELECTRONIC ASSEMBLY HAVING A PERIMETER AROUND A MEMS DEVICE

(75) Inventor: Jason A. Garcia, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 313 days.

(21) Appl. No.: 10/843,885

(22) Filed: May 11, 2004

(65) Prior Publication Data

US 2005/0253207 A1 Nov. 17, 2005

(51) Int. Cl.
*H01L 23/28* (2006.01)
*H01L 23/29* (2006.01)

(52) U.S. Cl. .................... 257/778; 257/691; 257/737; 257/773; 257/776; 257/788; 257/E23.021; 257/E23.069

(58) Field of Classification Search ................ 257/691, 257/693, 704, 710, 737, 738
See application file for complete search history.

(56) References Cited

U.S. PATENT DOCUMENTS

| 5,591,034 | A | * | 1/1997 | Ameen et al. ................. 439/91 |
| 6,144,091 | A | * | 11/2000 | Washida ...................... 257/693 |
| 6,846,725 | B2 | * | 1/2005 | Nagarajan et al. .......... 438/456 |
| 6,861,740 | B2 | * | 3/2005 | Hsu ............................ 257/691 |
| 2002/0084532 | A1 | * | 7/2002 | Neogi et al. ................. 257/778 |

* cited by examiner

*Primary Examiner*—Jasmine Clark
(74) *Attorney, Agent, or Firm*—Blakely, Sokoloff, Taylor & Zafman LLP

(57) ABSTRACT

A microelectronic assembly is provided having a MEMS substrate, a MEMS device on the MEMS substrate, the MEMS device having a MEMS component which is movable relative to the MEMS substrate, a cover piece having a side over a side of the MEMS substrate on which the MEMS device is located, and a plurality of perimeter components, each having opposing portions sealing with the MEMS substrate and the cover piece respectively, the perimeter components forming a perimeter around the MEMS device.

25 Claims, 7 Drawing Sheets

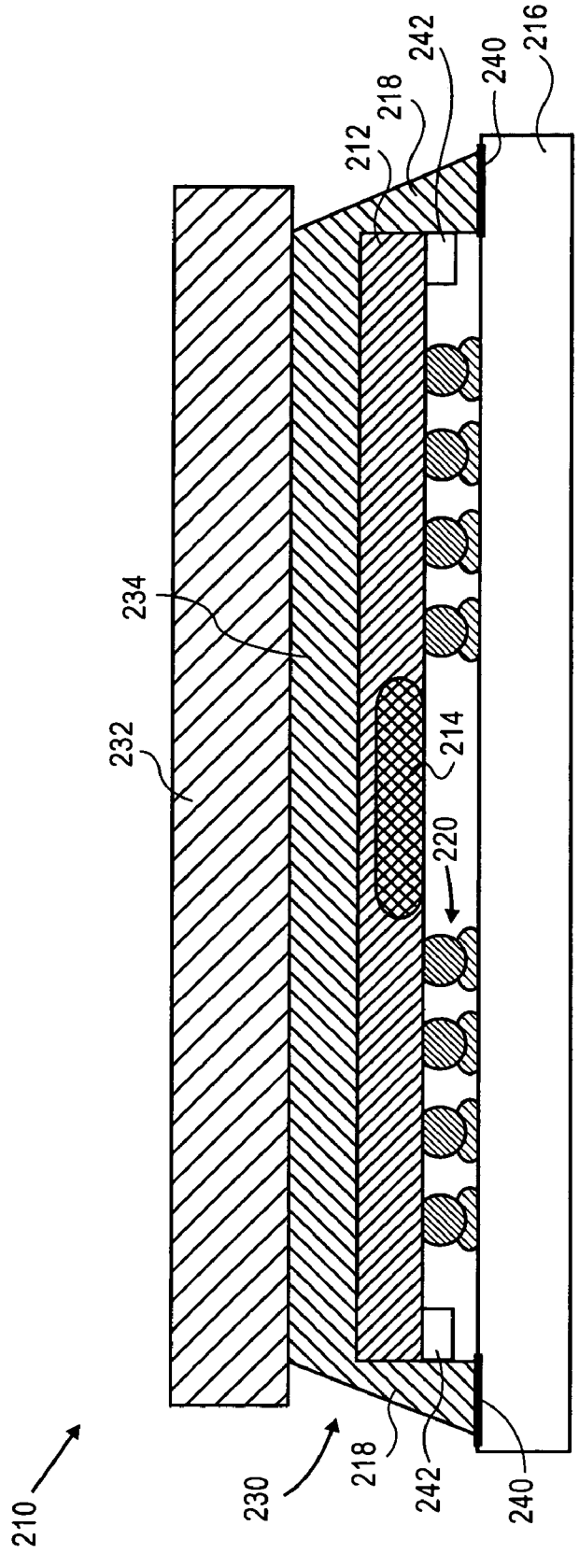
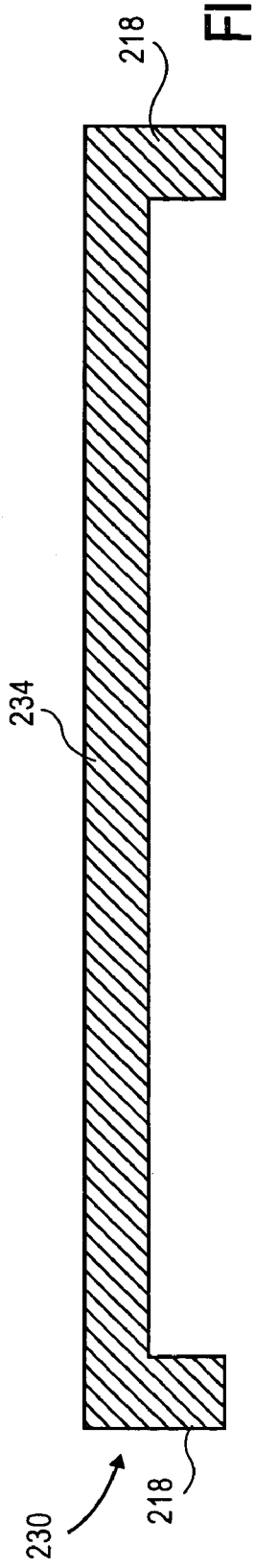

MICROELECTRONIC ASSEMBLY HAVING A PERIMETER AROUND A MEMS DEVICE

BACKGROUND OF THE INVENTION

1). Field of the Invention

This invention relates generally to a microelectronic assembly, and more specifically to sealing of a microelectromechanical systems (MEMS) device on a MEMS substrate.

2). Discussion of Related Art

MEMS devices are mechanical devices such as fluid sensors, mirrors, actuators, pressure and temperature sensors, vibration sensors, valves, etc. that are formed on or in MEMS substrates, utilizing technologies such as photolithography that allow for very small devices to be formed. A MEMS device typically has one or more components that are movable relative to the MEMS substrate. Such a component usually requires freedom of movement for proper functioning of the MEMS device. Contaminants or particles that come into contact with such a component can restrict its freedom of movement and cause failure of the MEMS device. Some MEMS devices may also fail when they are exposed to moisture.

BRIEF DESCRIPTION OF THE DRAWINGS

The invention is described by way of examples with reference to the accompanying drawings, wherein:

FIG. 5 is a cross-sectional side view of a microelectronic assembly according to a further embodiment of the invention, wherein a thermal interface component is used to attached a heat sink and to form perimeter components;

FIG. 6 is a cross-sectional side view of the thermal interface component before being reflowed;

DETAILED DESCRIPTION OF THE INVENTION

Figure 1:
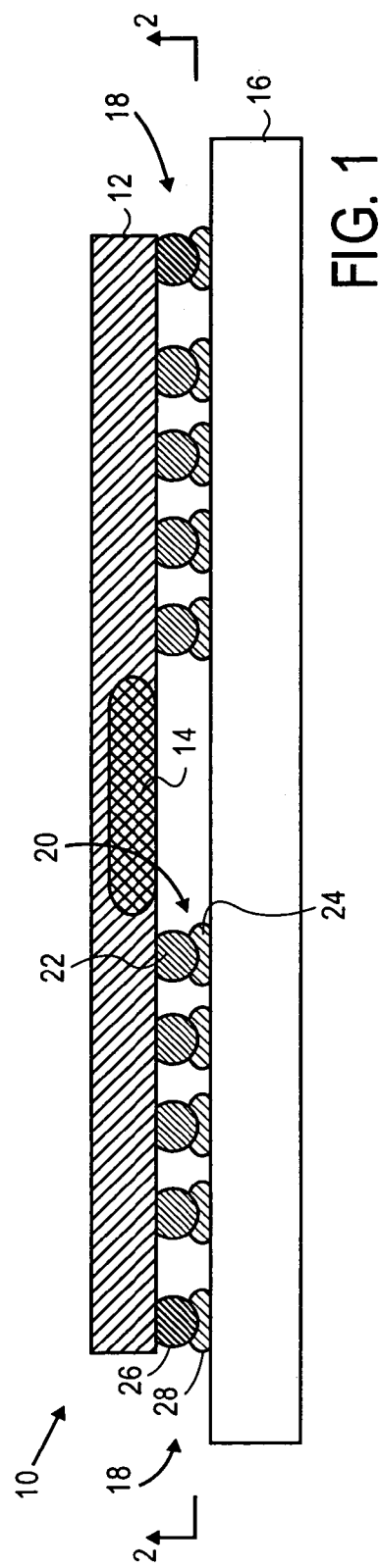
FIG. 1 is a cross-sectional side view of a microelectronic assembly according to one embodiment of the invention, wherein perimeter components seal a MEMS device and interconnection elements against the ingress of contaminants and moisture.

FIG. 1 of the accompanying drawings illustrates a microelectronic assembly 10, according to an embodiment of the invention, including a MEMS substrate 12, a MEMS device 14 on the MEMS substrate 12, a carrier substrate 16 forming a cover piece over the MEMS device 14, a plurality of perimeter components 18 and a plurality of interconnection elements 20.

The MEMS substrate 12 has a plurality of alternating dielectric and metal layers. The metal layers are patterned to form conductors. The conductors are connected to the MEMS device 14 and an integrated circuit formed within the MEMS substrate 12.

The MEMS device 14 is manufactured on a lower side of the MEMS substrate 12. The MEMS device 14 has one or more components that are movable relative to the MEMS substrate 12. In order to allow for freedom of movement of the component or components, and proper functioning of the MEMS device 14, it is required that contaminants or particles be kept away from the component or components.

The carrier substrate 16 has a plurality of alternating dielectric and metal layers. The metal layers are patterned to provide redistribution of signals, ground and power through the carrier substrate 16.

Each interconnection element 20 includes a respective solder ball 22 on a lower side of the MEMS substrate 12, and a respective conductive land 24 on an upper side of the carrier substrate 16. Each solder ball 22 is electrically connected to a respective metal line formed in the MEMS substrate 12, and each conductive land 24 is electrically connected to a respective metal line formed in the carrier substrate 16. The MEMS substrate 12 is placed on the carrier substrate 16. As mentioned, the carrier substrate 16 then forms a cover piece over the MEMS device 14. Each solder ball 22 is then in contact with a respective one of the conductive lands 24.

The entire assembly is placed in a reflow oven, which heats the solder balls 22 so that they melt and join with the conductive lands 24. The assembly is then allowed to cool, so that the solder balls 22 again solidify. Each solder ball 22 is then electrically and structurally connected to a respective one of the conductive lands 24.

Signals can then be provided from the metal lines in the carrier substrate 16 through the interconnection elements 20 and the metal lines in the MEMS substrate 12 to and from the MEMS device 14. Power and ground are also provided to the MEMS device 14. The signals, power, and ground allow for functioning of the MEMS device 14, i.e., movement of the movable component or components of the MEMS device 14.

Each perimeter component 18 includes a respective bar 26 and a respective pad 28. The bars 26 are attached to the lower side of the MEMS substrate 12 and are substantially the same height as the solder balls 22. The pads 28 are located on the upper side of the carrier substrate 16 and are substantially the same height as the conductive lands 24. Each bar 26 is located on a respective pad 28 at the same time that the solder balls 22 are located on the conductive lands 24. The bars 26 melt when the solder balls 22 are melted, so that the bars 26 join with the pads 28. In another embodiment the solder balls 22 and the bars 26 may be made of a high melting temperature material such as copper and do not melt, in which case the conductive lands 24 and the pads 28 melt and reflow. Subsequent cooling causes solidification of the bars 26, whereafter each bar 26 is structurally connected to a respective pad 28. The respective perimeter component 18 then seals at the top with the lower side of the MEMS substrate and at the bottom with the upper side of the carrier substrate 16. The perimeter component 18 prevents contaminants or moisture from entering laterally into a space between the carrier substrate 16 and the MEMS substrate 12 where the interconnection elements 20 and the MEMS device 14 are located.

Figure 2:
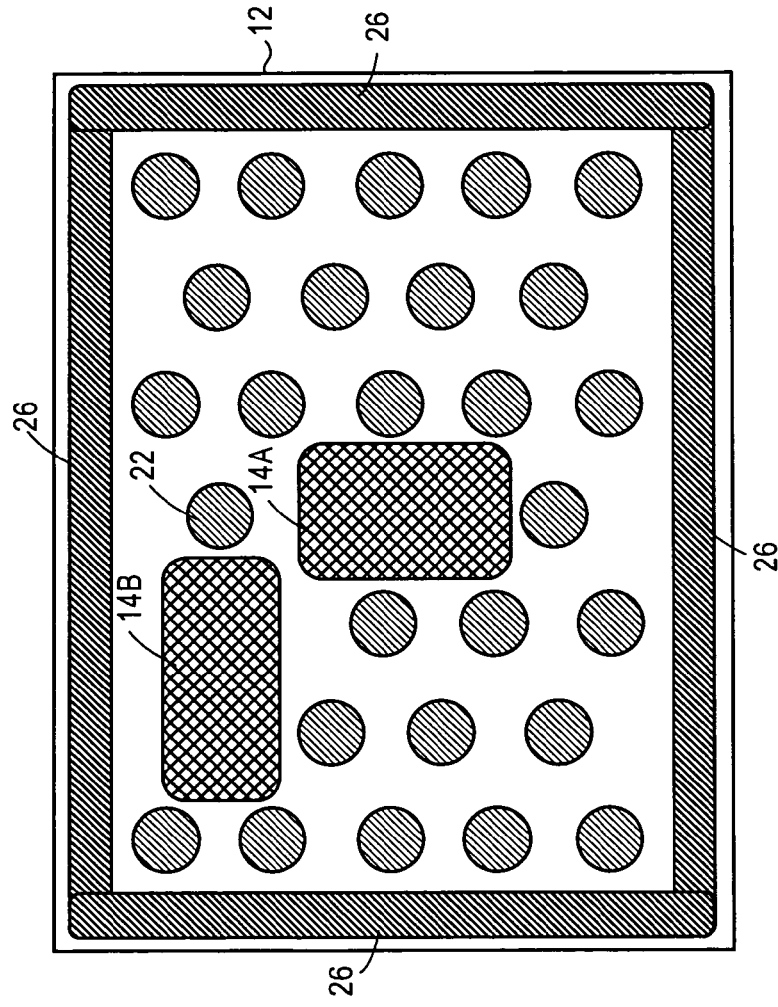
FIG. 2 is a bottom view on 2-2 in FIG. 1.

As illustrated in FIG. 2, the bars 26 (and corresponding perimeter components) are located on all four edges of the MEMS substrate 12. More than one MEMS device 14A and 14B may be provided. The bars 26 form a perimeter which is a continuous ring around the MEMS devices 14A and 14B, as well as the solder balls 22. Because of the continuous ring provided by the perimeter formed by the bars 26, the MEMS devices 14A and 14B as well as the solder balls 22 are sealed against contaminates and particles.

Figure 3:
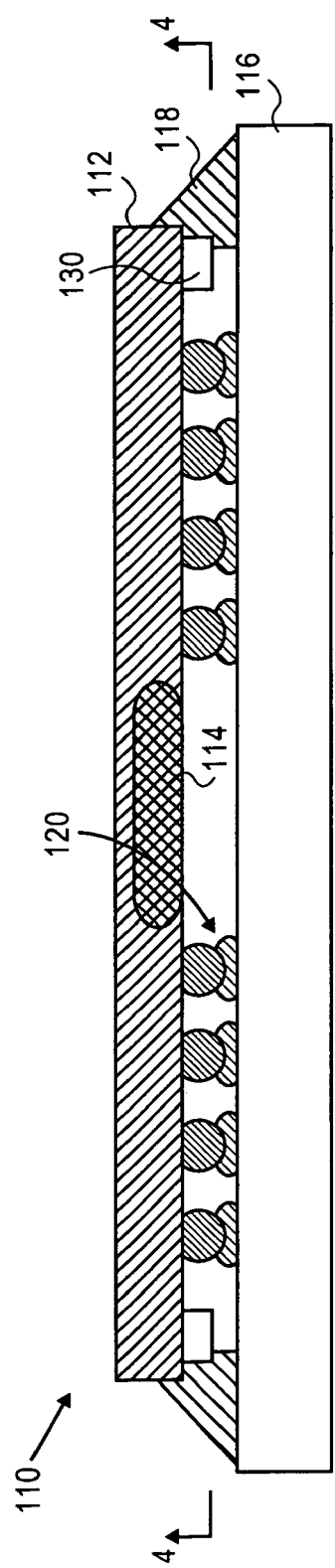
FIG. 3 is cross-sectional side view of a microelectronic assembly according to another embodiment of the invention having alternative perimeter components.

FIG. 3 illustrates a microelectronic assembly 110 according to another embodiment of the invention, including a MEMS substrate 112, a MEMS device 114, a carrier substrate 116, a plurality of perimeter components 118, and a plurality of interconnection elements 120. The perimeter components 118 are located adjacent an edge of the MEMS substrate 112. The perimeter components 118 are heated so that they melt onto an upper side of the carrier substrate 116 and against the side edge of the MEMS substrate 112. A perimeter flow barrier 130 is located near the edge of the MEMS substrate 12 and prevents the perimeter component 118 from flowing into a space between the carrier substrate 116 and the MEMS substrate 112. The microelectronic assembly 110 of FIG. 3 is the same as the microelectronic assembly 10 of FIG. 1 in all other respects.

Figure 4:
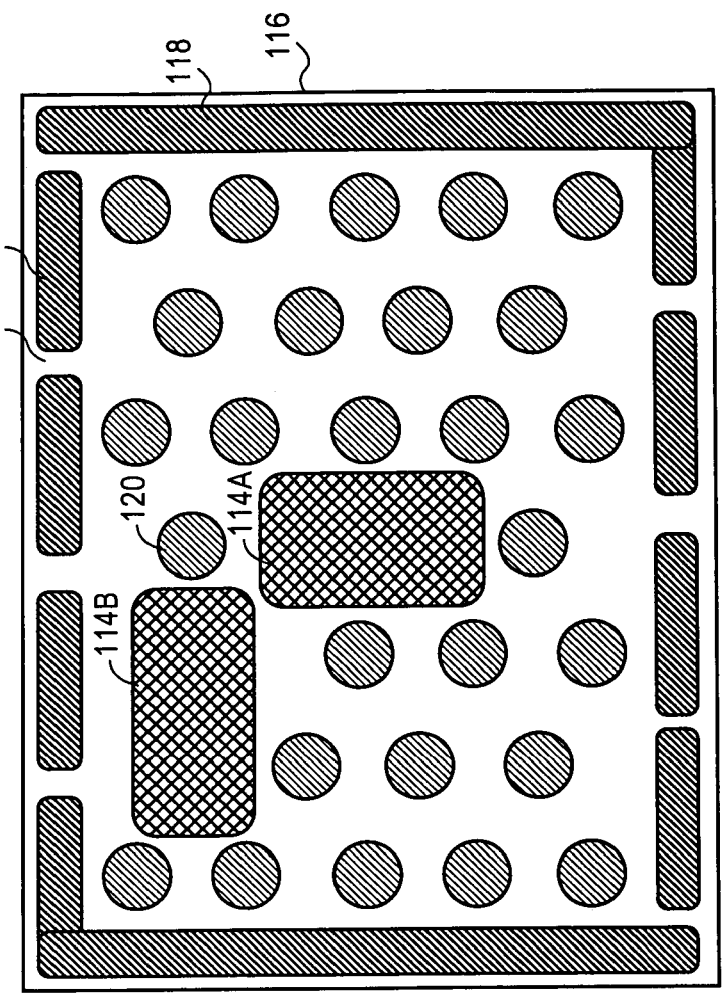
FIG. 4 is a bottom view on 4-4 in FIG. 3.

As illustrated in FIG. 4, the perimeter components 118 are located around two of the MEMS devices 114A and 114B, as well as around the interconnection elements 120. Gaps 132 are formed between adjacent ones of the perimeter components 118 so that the perimeter formed by the perimeter components 118 is not continuous around the MEMS devices 114A and 114B and the interconnection elements 120. The gaps 132 allow for multiple structures that can perform separate functions, e.g., power delivery, ground, or signal delivery. The gaps 132 are still sufficiently small to prevent contaminants and particles from entering into the perimeter. However, the perimeter does not hermetically seal the MEMS devices 114A and 114B and the interconnection elements 120.

FIG. 5 illustrates a microelectronic assembly 210 according to yet a further embodiment of the invention, including a MEMS substrate 212, a MEMS device 214 on a lower side of the MEMS substrate 212, a carrier substrate 216, interconnection elements 220, a thermal interface component 230, and a heat sink 232.

The MEMS substrate 212, MEMS device 214, carrier substrate 216, and interconnection elements 220 are constructed in the same manner as the microelectronic assembly 10 of FIG. 1. The only difference is that the microelectronic assembly 210 does not have perimeter components such as the perimeter components 18 of FIG. 1.

FIG. 6 illustrates the thermal interface component 230 before being reflowed as illustrated in FIG. 5. The thermal interface component 230 has a central portion 234 and perimeter components 218 extending downwardly from edges of the central portion 234.

Referring again to FIG. 5, the central portion 234 is placed on top of the MEMS substrate 212 with the perimeter components 218 extending downwardly past edges of the MEMS substrate 212. The perimeter components 218 are, at this state, still in the square shape illustrated in FIG. 6. The heat sink 232 is then placed on top of the central portion 234 of the thermal interface component 230. The assembly 210 of FIG. 5 is then heated in a reflow oven so that the perimeter components 218 melt and drop onto an upper side of the carrier substrate 216. The assembly 210 is subsequently allowed to cool, so that the perimeter components 218 solidify and retain their fillet shape as illustrated in FIG. 5. Heating and subsequent cooling of the assembly 210 also attaches the central portion 234 to an upper side of the MEMS substrate 212, and the heat sink 232 to an upper side of the central portion 234.

It can thus be seen that the perimeter components 218 are formed at the same time that the heat sink 232 is attached via the thermal interface components 230 to the MEMS substrate 212. The perimeter components 218 then seal the MEMS device 214 and the interconnection elements 220. Pads 240 are formed on an upper side of the carrier substrate 216, to promote wetting of the perimeter components 218, and proper sealing of the perimeter components 218 with the carrier substrate 216. Perimeter flow barriers 242 limit the flow of the perimeter components 218 into a space between the MEMS substrate 212 and the carrier substrate 216.

Figure 7:
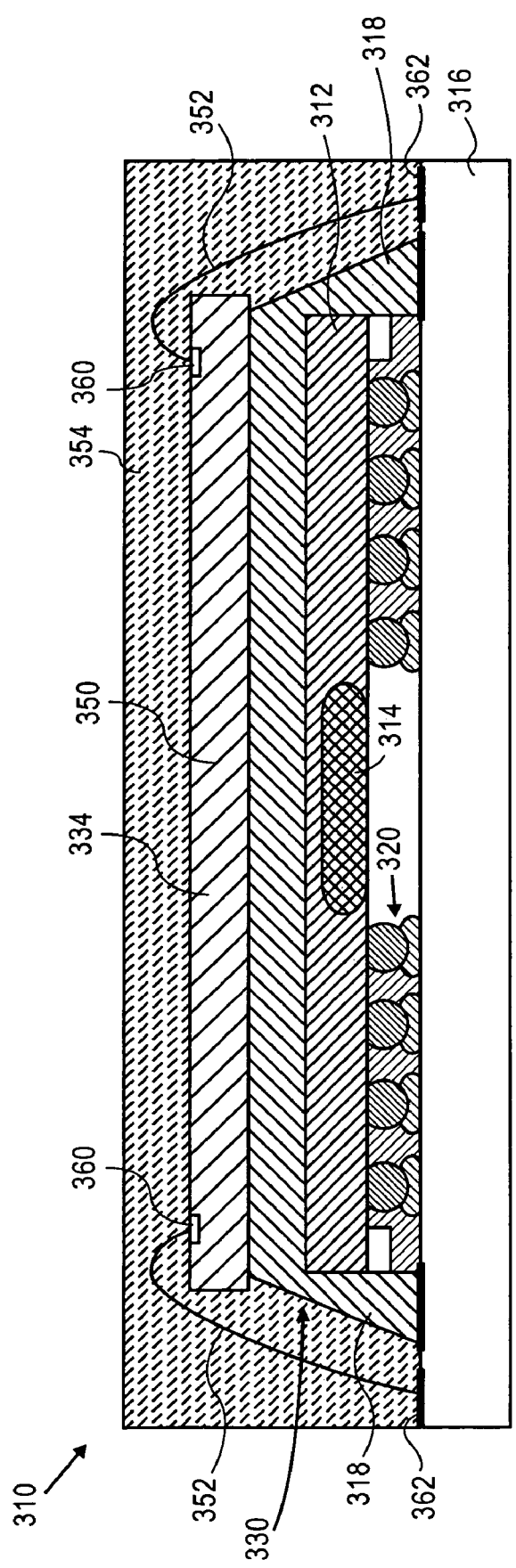
FIG. 7 is a cross-sectional side view of a microelectronic assembly according to yet a further embodiment of the invention, which is similar to the embodiment of FIG. 5 except that the heat sink is replaced with a wirebonded microelectronic die.

FIG. 7 illustrates a microelectronic assembly 310 according to yet a further embodiment of the invention, including a MEMS substrate 312, a MEMS device 314 on a lower side of the MEMS substrate, a carrier substrate 316, interconnection elements 320, a thermal interface component 330, a microelectronic die 350, wirebonding wires 352, and encapsulation 354.

The microelectronic assembly 310 is constructed in the same manner as the microelectronic assembly 210 of FIG. 5. The microelectronic die 350 is placed on the thermal interface component 330, instead of the heat sink 232 of FIG. 5. The thermal interface component 330 has a central portion 334 and perimeter components 318, like the microelectronic assembly 210 of FIG. 5. The thermal interface component 330 is used to attach the microelectronic die 350 to the MEMS substrate 312.

The microelectronic die 350 has an integrated circuit formed therein. Terminals 360 are formed on an upper surface and near edges of the microelectronic die 350. The terminals 360 are in communication with the integrated circuit formed in the microelectronic die 350.

Terminals 362 are formed on an upper surface of the carrier substrate 316 outside an area of the perimeter components 318. Each wirebonding wire 352 has opposing ends that are attached to one of the terminals 360 and one of the terminals 362, respectively. The wirebonding wires 352 connect the carrier substrate 316 electrically to the microelectronic die 350.

The encapsulation 354 is formed over the component hereinbefore mentioned. The encapsulation 354 protects the wirebonding wires 352 and the microelectronic die 350.

It can thus be seen that the MEMS device 314 and the interconnection elements 320 are protected against contaminants. A three-dimensional arrangement is provided by the microelectronic die 350 and the wirebonding wires 352 that connect the microelectronic die 350 to the carrier substrate 316.

Although FIG. 7 illustrates a wirebonded die on top of a flipchip die, other arrangements may also be possible. One such arrangement may be a folded substrate having two flipchip dies on top of one another.

Figure 8:
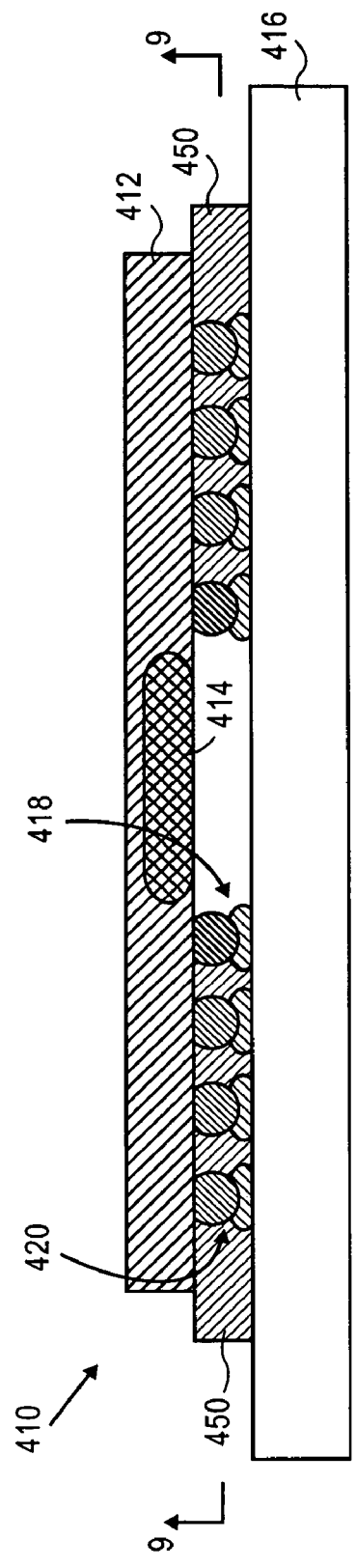
FIG. 8 is a cross-sectional side view of a microelectronic assembly according to yet a further embodiment of the invention, wherein a perimeter is formed around a MEMS device and not around interconnection elements.

FIG. 8 illustrates a microelectronic assembly 410 according to yet a further embodiment of the invention, including a MEMS substrate 412, a MEMS device 414 on a lower side of the MEMS substrate 412, a carrier substrate 416, perimeter components 418, interconnection elements 420, and an underfill material 450.

The microelectronic assembly 410 of FIG. 8 is similar to the microelectronic assembly 10 of FIG. 1. In the embodiment of FIG. 8, the perimeter components 418 are close to the MEMS device 414 and to the interconnection elements 420 are located outside a perimeter formed by the perimeter components 418. The perimeter components 418 thus only form a perimeter around the MEMS device 414 and not also around the interconnection elements 420.

An advantage of the embodiment of FIG. 8 is that the perimeter components 418 can be made smaller, since a smaller perimeter is required. The underfill material 450 is introduced into a space with the MEMS substrate 412 and the carrier substrate 416 around the perimeter formed by the perimeter components 418. The underfill material 450 is located between the interconnection elements 420. The underfill material 450 is typically a polymer which is cured so that it hardens. The underfill material 450 then protects the interconnection elements 420 against structural damage and against contaminants and particles.

Figure 9:
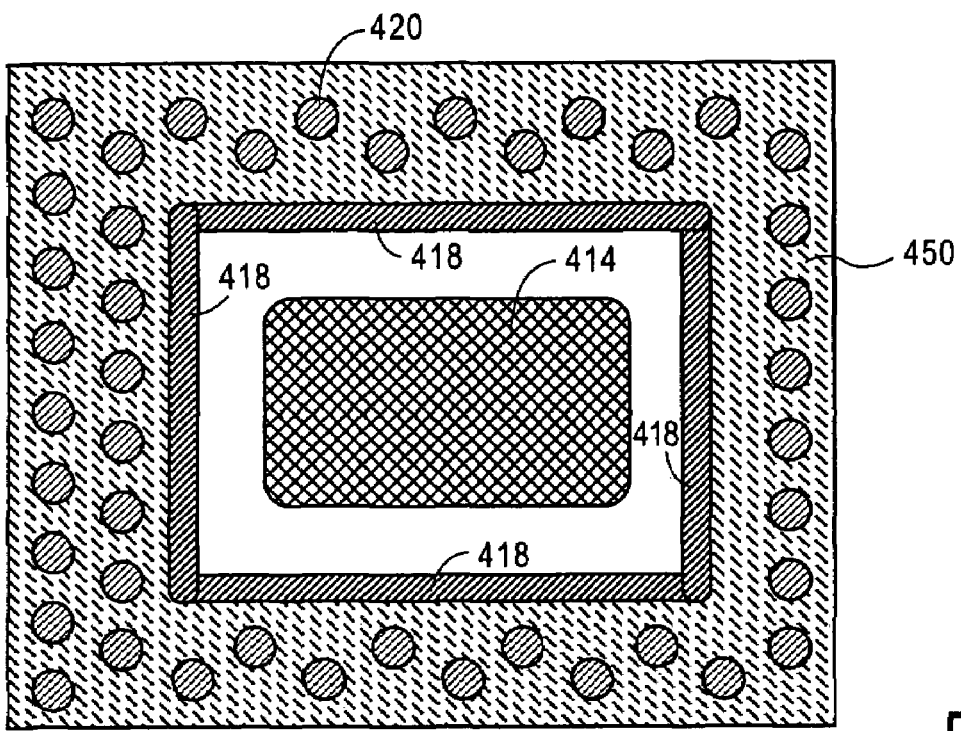
FIG. 9 is a bottom view on 9-9 in FIG. 8 illustrating a continuous perimeter.
Figure 10:
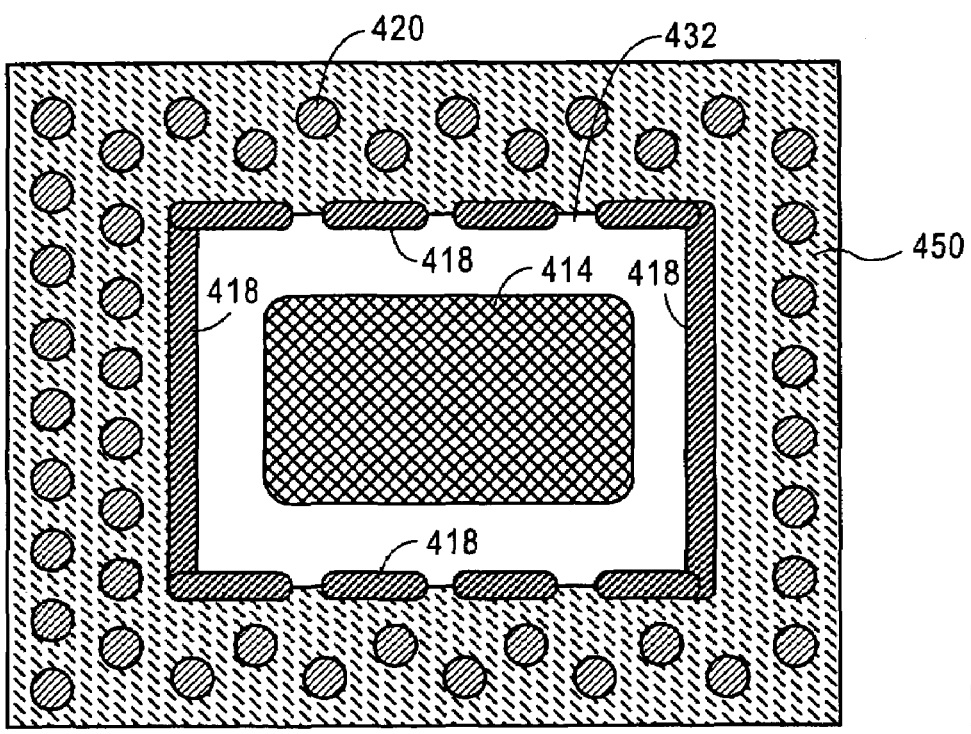
FIG. 10 is a view similar to FIG. 9 of an alternative embodiment wherein the perimeter is not continuous.

As illustrated in FIG. 9, the perimeter components 418 may form a continuous ring around the MEMS device 414. The perimeter formed by the perimeter components 418 seals the MEMS device 414, which may be advantageous if the underfill material 450 allows moisture through. Alternatively, as illustrated in FIG. 10, the perimeter components 418 may form gaps 432 between them to allow for flexibility of design. The underfill material 450 around the perimeter formed by the perimeter components 418 provides mechanical protection for the interconnection elements 420. The gaps 432 are still sufficiently small to keep the underfill material 450 away from the MEMS device 414.

Figure 11:
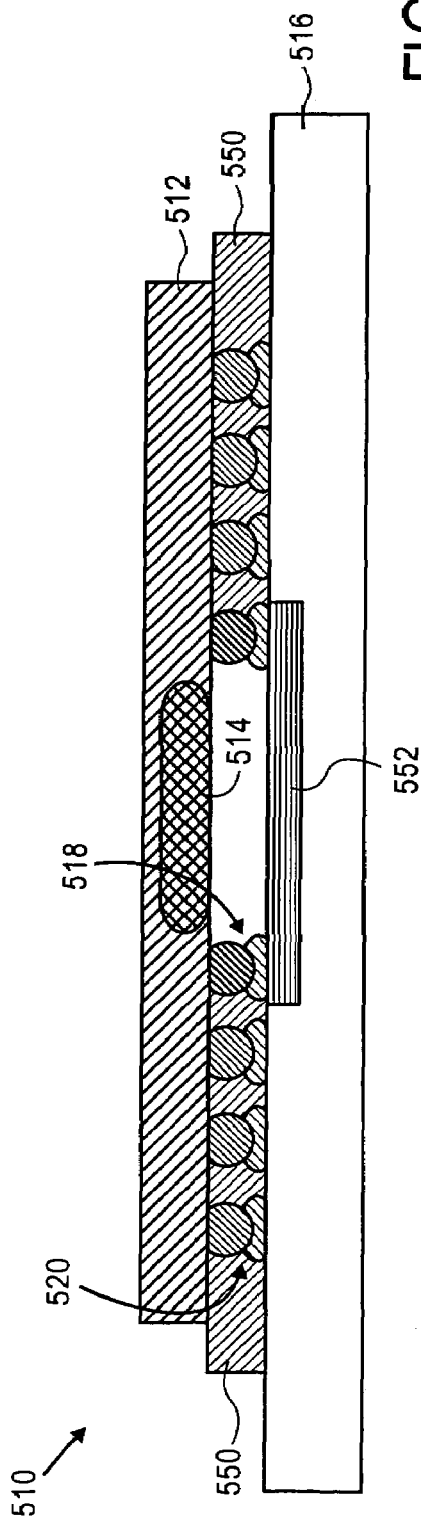
FIG. 11 is a cross-sectional side view of a microelectronic assembly according to yet a further embodiment of the invention which is similar to the embodiment of FIG. 8 except that a hermetic plane is provided.

FIG. 11 illustrates a microelectronic assembly 510 according to yet a further embodiment of the invention. The microelectronic assembly 510, like the microelectronic assembly 410 of FIG. 8, includes a MEMS substrate 512, a MEMS device 514 on a lower side of the MEMS substrate 512, a carrier substrate 516, perimeter components 518, interconnection elements 520, and an underfill material 550. The microelectronic assembly 510 is assembled in the same manner as the microelectronic assembly 410 of FIG. 8. The microelectronic assembly 510 further has a hermetic plane 552 formed within an upper side of the carrier substrate 516. The hermetic plane 552 may, for example, be a metal which is impervious to water. The perimeter components 518 are formed along edges on an upper side of the hermetic plane 552. By forming the perimeter components 518 into a continuous perimeter as illustrated in FIG. 9, the space below the MEMS device 514 is sealed against moisture laterally from the sides and from below. A hermetic substrate can be provided by incorporating a hermetic plane in any of the embodiments described herein having a continuous perimeter and provide a hermetic seal.

Figure 12:
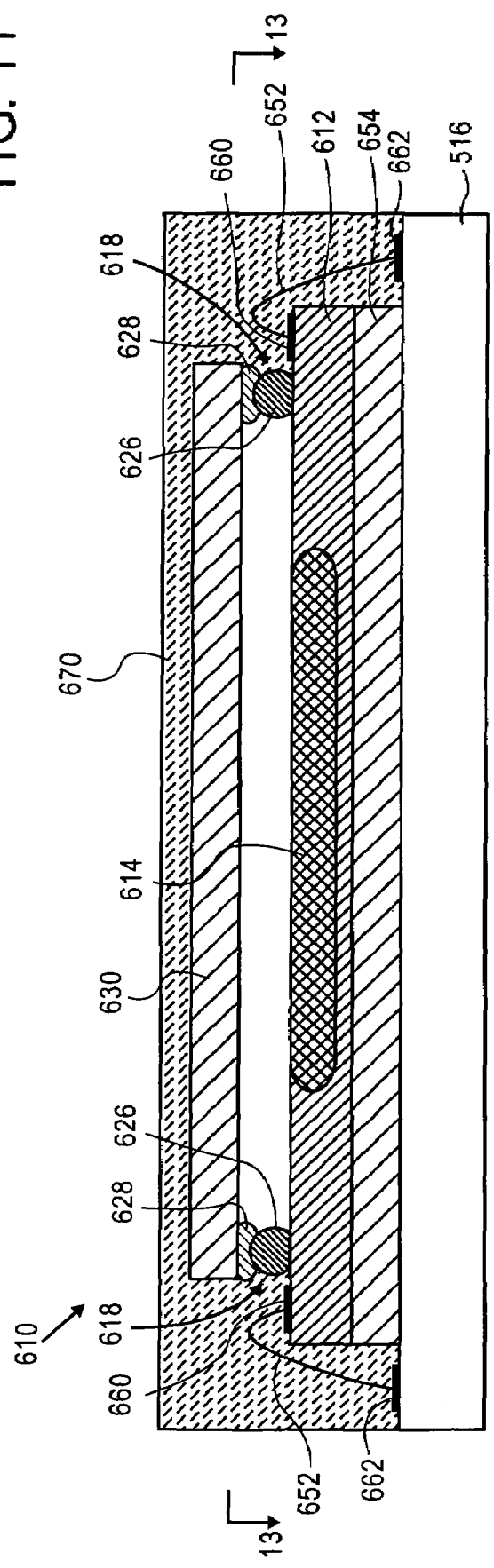
FIG. 12 is a cross-sectional side view of a microelectronic assembly according to yet a further embodiment of the invention, having a MEMS device on an upper side of a MEMS substrate and wirebonding wires are connected to the MEMS substrate.

FIG. 12 illustrates a microelectronic assembly 610 according to yet a further embodiment of the invention, including a MEMS substrate 612, a MEMS device 614 on an upper side of the MEMS substrate 612, a carrier substrate 616, a cover piece 630, perimeter components 618, and wirebonding wires 652.

The MEMS substrate has a lower side which is attached to an upper side of the carrier substrate 616 with a die attached material 654. The cover piece 630 is placed over the upper side of the MEMS substrate 612 having the MEMS device 614. In another embodiment another device such as a microelectronic die can be placed instead of the cover piece 630. The perimeter components 618 include bars 626 on the MEMS substrate 612 and pads 628 on a lower side of the cover piece 630. The bars 626 are attached to the pads 628 in the same manner that the bars 26 are attached to the pads 28 in FIG. 1.

Terminals 660 are formed on an upper side on the MEMS substrate 612 in an area outside the perimeter components 618. More terminals 662 are formed on an upper side of the carrier substrate 616 in an area around the MEMS substrate 612. Each wirebonding wire 652 has opposing ends attached respectively to one of the terminals 660 and one of the terminals 662. The wirebonding wires 652 connect the MEMS substrate 612 electrically to the carrier substrate 616.

An encapsulant 670 is formed over the component hereinbefore mentioned. The encapsulant 670 protects the wirebonding wires 652, terminals 660 and 662, and the perimeter components 618.

It can thus be seen that a microelectronic assembly 610 is provided having wirebonding wires 652 connected to the MEMS device 614 at the top of the MEMS substrate 612, and the MEMS device 614 is protected against the ingress of contaminants.

Figure 13:
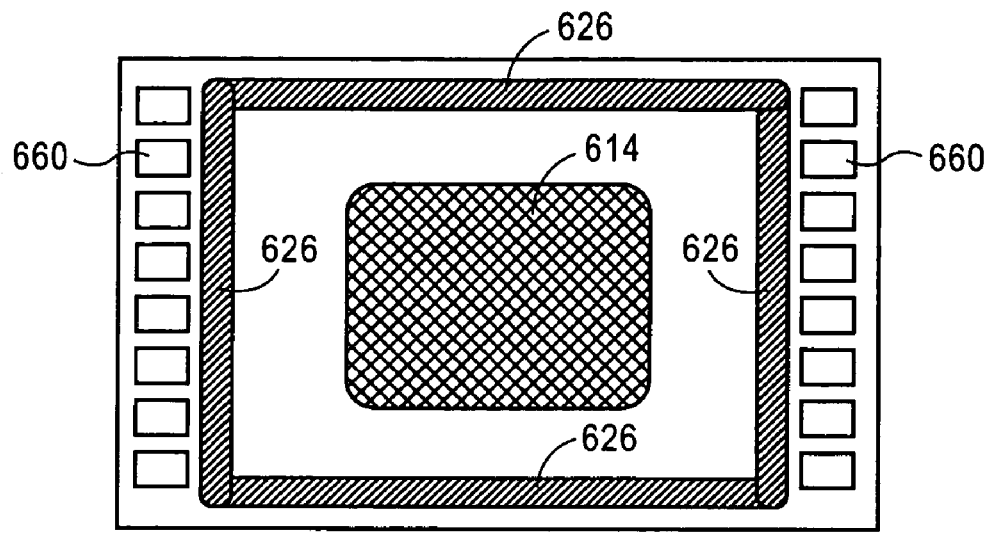
FIG. 13 is a view on 13-13 in FIG. 12, illustrating that a perimeter formed by perimeter components is continuous to seal the MEMS device.
Figure 14:
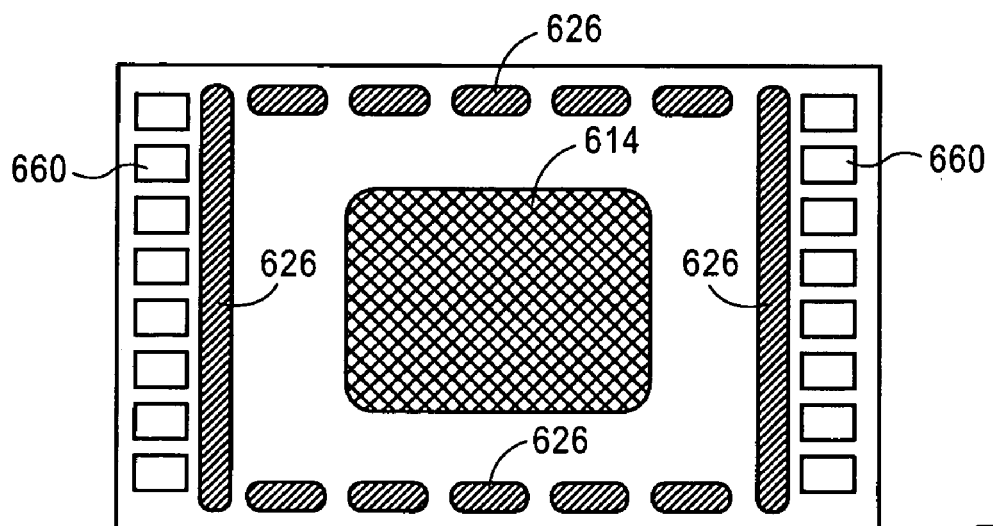
FIG. 14 is a view similar to FIG. 13 of an alternative embodiment wherein the perimeter is not continuous.

As illustrated in FIGS. 13 and 14, the bars 626 (and corresponding perimeter components) may form a continuous ring (FIG. 13) or may have gaps between them (FIG. 14). In the embodiment of FIG. 13, the perimeter components 626 form a perimeter that seals the MEMS device 614. The perimeter formed by the perimeter components 626 in the embodiment of FIG. 4 does not by itself protect the MEMS device 614 against contaminated particles. However, the encapsulation 670 in FIG. 12 may still protect the MEMS device 614 against contaminants and particles.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A microelectronic assembly, comprising:
   a MEMS substrate;
   a MEMS device on the MEMS substrate, the MEMS device having a MEMS component which is movable relative to the MEMS substrate;
   a cover piece having a side over a side of the MEMS substrate on which the MEMS device is located; and
   a plurality of perimeter components, each having opposing portions sealing with the MEMS substrate and the cover piece respectively, the perimeter components forming a continuous perimeter around the MEMS device to seal the MEMS device.

2. The microelectronic assembly of claim 1, further comprising:
   a plurality of interconnection elements between the MEMS substrate and the cover piece, the cover piece being a carrier substrate and the interconnection elements connecting the carrier substrate electrically to the MEMS substrate.

3. The microelectronic assembly of claim 2, wherein the interconnection elements are within the perimeter.

4. The microelectronic assembly of claim 3, wherein each interconnection element includes a respective solder ball and a respective land to which the respective solder ball is soldered, and each perimeter piece includes a respective bar and a respective pad to which the respective bar is soldered.

5. The microelectronic assembly of claim 1, further comprising:
a thermal interface component placed over the MEMS substrate, heated so that edge portions thereof reflow and drop onto the cover piece over the MEMS device, and allow it to cool.

6. The microelectronic assembly of claim 5, further comprising:
a heat sink on the thermal interface component.

7. The microelectronic assembly of claim 5, further comprising:
an electronic component on the thermal interface material; and
wirebonding wires connecting the electronic component with the cover piece over the MEMS device.

8. The microelectronic assembly of claim 5, further comprising:
a plurality of interconnection elements between the MEMS substrate and the cover piece, the cover piece being the carrier substrate and the interconnection elements connecting the carrier substrate electrically to the MEMS substrate.

9. The microelectronic assembly of claim 8, wherein the interconnection elements are within the perimeter.

10. The microelectronic assembly of claim 1, further comprising:
a plurality of interconnection elements between the MEMS substrate and the cover piece, the cover piece being a carrier substrate and the interconnection elements connecting the carrier substrate electrically to the MEMS substrate, the interconnection elements being located outside the perimeter.

11. The microelectronic assembly of claim 10, wherein each interconnection element includes a respective solder ball and a respective land to which the respective solder ball is soldered, and each perimeter piece includes a respective bar and a respective pad to which the respective bar is soldered.

12. The microelectronic assembly of claim 10, wherein the perimeter forms a continuous ring around the MEMS device to seal the MEMS device.

13. The microelectronic assembly of claim 10, wherein the perimeter components have gaps between them so that the perimeter is not continuous around the MEMS device.

14. The microelectronic assembly of claim 1, further comprising:
a support substrate, the MEMS substrate being placed on the support substrate;
first contact pads on the MEMS substrate outside the perimeter;
second contact pads on the support substrate; and
wirebonding wires connecting each one of the first contact pads with a respective one of the second contact pads.

15. The microelectronic assembly of claim 14, wherein the perimeter forms a continuous ring around the MEMS device to seal the MEMS device.

16. The microelectronic assembly of claim 14, wherein the perimeter components form gaps between them so that the perimeter is not continuous around the MEMS device.

17. A microelectronic assembly, comprising:
a first substrate;
a second substrate having a side facing aside of the first substrate;
a plurality of interconnection, elements between the first and second substrates, the interconnection elements connecting the first substrate electrically to the second substrate; and
a plurality of perimeter components, each having opposing portions sealing with the first substrate and the second substrate respectively, the perimeter components forming a perimeter around the interconnection elements wherein the perimeter components have gaps between them so that the perimeter is not continuous around the interconnection elements.

18. The microelectronic assembly of claim 17, wherein each interconnection element includes a respective solder ball and a respective land to which the respective solder ball is soldered, and each perimeter piece includes a respective bar and a respective pad to which the respective bar is soldered.

19. A microelectronic assembly, comprising:
a MEMS substrate;
a MEMS device on the MEMS substrate, the MEMS device having a MEMS component which is movable relative to the MEMS substrate;
a cover piece having a side over a side of the MEMS substrate on which the MEMS device is located;
a plurality of perimeter components, each having opposing portions sealing with the MEMS substrate and the cover piece respectively, the perimeter components forming a perimeter around the MEMS device; and
a plurality of interconnection elements between the MEMS substrate and the cover piece, the cover piece being a carrier substrate and the interconnection elements connecting the carrier substrate electrically to the MEMS substrate, the interconnection elements being located outside the perimeter.

20. The microelectronic assembly of claim 19, wherein each interconnection element includes a respective solder ball and a respective land to which the respective solder ball is soldered, and each perimeter piece includes a respective bar and a respective pad to which the respective bar is soldered.

21. The microelectronic assembly of claim 19, wherein the perimeter forms a continuous ring around the MEMS device to seal the MEMS device.

22. A microelectronic assembly, comprising:
a MEMS substrate;
a MEMS device on the MEMS substrate, the MEMS device having a MEMS component which is movable relative to the MEMS substrate;
a cover piece having a side over a side of the MEMS substrate on which the MEMS device is located;
a plurality of perimeter components, each having opposing portions sealing with the MEMS substrate and the cover piece respectively, the perimeter components forming a perimeter around the MEMS device;
a support substrate, the MEMS substrate being placed on the support substrate;
first contact cads on the MEMS substrate outside the perimeter;
second contact pads on the support substrate; and wirebonding wires connecting each one of the first contact pads with a respective one of the second contact pads.

23. The microelectronic assembly of claim 22, wherein the perimeter forms a continuous ring around the MEMS device to seal the MEMS device.

24. The microelectronic assembly of claim 22, wherein the perimeter components form gaps between them so that the perimeter is not continuous around the MEMS device.

25. A microelectronic assembly, comprising:
a first substrate;
a second substrate having a side facing a side of the first substrate;
a plurality of interconnection elements between the first and second substrates, the interconnection elements connecting the first substrate electrically to the second substrate wherein each interconnection element includes a respective solder ball and a respective land to which the respective solder ball is soldered;
a plurality of perimeter components, each having opposing portions sealing with the first substrate and the second substrate respectively, the perimeter components forming a perimeter around the interconnection elements, and each perimeter component includes a respective bar and a respective pad to which the respective bar is soldered.

* * * * *

UNITED STATES PATENT AND TRADEMARK OFFICE
CERTIFICATE OF CORRECTION

| | | |
|---|---|---|
| PATENT NO. | : 7,262,509 B2 | Page 1 of 1 |
| APPLICATION NO. | : 10/843885 | |
| DATED | : August 28, 2007 | |
| INVENTOR(S) | : Garcia | |

It is certified that error appears in the above-identified patent and that said Letters Patent is hereby corrected as shown below:

In column 8, at line 6, delete "aside" and insert --a side--.

In column 8, at line 65, delete "cads" and insert --pads--.

Signed and Sealed this

Twenty Second Day of April, 2008

JON W. DUDAS
*Director of the United States Patent and Trademark Office*